United States Patent
Choi et al.

(10) Patent No.: US 11,189,550 B2
(45) Date of Patent: Nov. 30, 2021

(54) LOW-COST SEMICONDUCTOR PACKAGE USING CONDUCTIVE METAL STRUCTURE

(71) Applicant: JMJ Korea Co., Ltd., Bucheon-si (KR)

(72) Inventors: Yun Hwa Choi, Bucheon-si (KR); In Suk Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 42 days.

(21) Appl. No.: 16/354,198

(22) Filed: Mar. 15, 2019

(65) Prior Publication Data

US 2019/0311975 A1    Oct. 10, 2019

(30) Foreign Application Priority Data

Apr. 10, 2018  (KR) .................. KR10-2018-0041757
Feb. 22, 2019  (KR) .................. KR10-2019-0020829

(51) Int. Cl.
  *H01L 23/495*  (2006.01)
  *H01L 23/31*   (2006.01)
  *H01L 23/00*   (2006.01)

(52) U.S. Cl.
  CPC .... *H01L 23/49524* (2013.01); *H01L 23/3107* (2013.01); *H01L 24/08* (2013.01); *H01L 24/33* (2013.01); *H01L 24/40* (2013.01); *H01L 2924/01013* (2013.01)

(58) Field of Classification Search
  CPC ... H01L 23/49524; H01L 24/33; H01L 24/40; H01L 24/84
  See application file for complete search history.

(56) References Cited

U.S. PATENT DOCUMENTS

| | | | |
|---|---|---|---|
| 2009/0032958 A1* | 2/2009 | Farrar | H01L 21/32051 257/771 |
| 2009/0189259 A1* | 7/2009 | Mohamed | H01L 23/49524 257/666 |
| 2016/0211242 A1* | 7/2016 | Gruber | H01L 25/0657 |
| 2016/0234945 A1* | 8/2016 | Nagata | C22C 1/03 |
| 2017/0288654 A1* | 10/2017 | Otremba | H01L 24/05 |
| 2019/0067142 A1* | 2/2019 | Fang | H01L 23/3114 |
| 2020/0126944 A1* | 4/2020 | Joshi | H01L 24/29 |

FOREIGN PATENT DOCUMENTS

| | | |
|---|---|---|
| JP | 2009-514242 A | 4/2009 |
| KR | 10-1208332 B1 | 12/2012 |
| KR | 10-1631232 B1 | 6/2016 |
| KR | 10-1643332 B1 | 7/2016 |
| KR | 10-1669902 B1 | 10/2016 |
| KR | 20-0482370 Y1 | 2/2017 |
| KR | 10-2017-0086828 A1 | 7/2017 |
| KR | 10-2018-0006839 A | 1/2018 |

\* cited by examiner

*Primary Examiner* — Michele Fan
(74) *Attorney, Agent, or Firm* — Park, Kim & Suh, LLC

(57) ABSTRACT

A low-cost semiconductor package using a conductive metal structure includes a lead frame including a pad and a lead, a semiconductor chip attached onto the pad of the lead frame, an Aluminum (Al) pad formed on the semiconductor chip, a clip structure having one side adhered to the Al pad and the other side adhered to the lead of the lead frame, and a sealing member formed to surround the semiconductor chip and the clip structure via molding, wherein the semiconductor chip is adhered directly to a junction of the lead frame through a first adhesive layer formed of a solder or epoxy resin-based material and is adhered directly to a junction of the Al pad and the clip structure through a second adhesive layer formed of a solder-based material.

10 Claims, 8 Drawing Sheets

LOW-COST SEMICONDUCTOR PACKAGE USING CONDUCTIVE METAL STRUCTURE

CROSS-REFERENCE TO RELATED APPLICATIONS

This application claims priority from Korean Patent Application No. 10-2019-0020829, filed on Feb. 22, 2019, and No. 10-2018-0041757, filed on Apr. 10, 2018, in the Korean Intellectual Property Office, the disclosure of which is incorporated herein by reference in its entirety.

BACKGROUND OF THE INVENTION

Field of the Invention

The present invention relate to a low-cost semiconductor package using a conductive metal structure, and more particularly, to a low-cost semiconductor package using a conductive metal structure, configured in such way that a semiconductor chip and a lead of a lead frame are electrically connected using a clip type conductive metal structure, and a junction is enhanced and a material of the metal structure is changed to achieve weight lightening of the semiconductor package and to reduce manufacturing costs.

Description of the Related Art

In general, a semiconductor package includes a semiconductor chip, a lead frame (or a substrate), and a package body, and the semiconductor chip is attached onto a pad of the lead frame and is electrically connected to a lead of the lead frame via bonding of a metal wire.

However, because a conventional stack package using a metal wire electrically exchanges a signal through a metal wire, a signal exchange speed of the stack package is low, and the electrical properties of each chip are degraded due to use of a large number of wires. An additional area of a substrate is required to form a metal wire to increase the size of the package, and a gap for wire bonding to a bonding pad of each chip is required, and thus, there is a problem in that the entire height of the package is unnecessarily increased.

Accordingly, the cited references disclosed by the present inventor, i.e., Korean Patent No. 1208332, Korean Utility Model No. 0482370, Korean Patent No. 1669902, and Korean Patent No. 1631232 disclose an effective package structure that uses a metallic clip structure to have excellent electrical connection performance, easy heat dissipation, and high thermal stability, compared with a conventional semiconductor package using a metal wire.

In particular, Korean Patent Publication No. 10-2017-0086828 (Clip bonding semiconductor chip package using metal bump) discloses a configuration in which a metal bump is formed to protrude on a bonding pad of a semiconductor chip and a clip is adhered onto the bonding pad. However, according to the cited references, a process such as wire melting, sputtering, electroplating, and screen printing needs to be performed to dispose a metal bump on a bonding pad, and thus, there is a problem in terms of degraded productivity, and the metal bump is formed of a material such as copper (Cu) or gold (Au), for facilitation of soldering, and thus, there is a problem in that coupling strength between the metal bump and the bonding pad is degraded and the electrical connection properties therebetween is not high due to different thermal expansion coefficients.

In addition, a conventional metallic clip has been formed of Cu due to a problem in terms of soldering. However, a metallic clip formed of Cu has high weight and high unit cost of products, and thus, there is a problem in that the weight of a semiconductor package is increased and manufacturing costs are increased. Such a problem in terms of weight lightening of a semiconductor package is directly associated to weights of various electronic products using a plurality of semiconductor packages as components, and thus may be considered as an important factor of product development.

SUMMARY OF THE INVENTION

The present invention provides a low-cost semiconductor package using a conductive metal structure, configured in such a way that the conductive metal structure is soldered directly to a metal pad prepared on an upper end of a semiconductor chip for bonding without use of a separate metal material like a conventional metal bump, thereby remarkably reducing producing costs and manufacturing processes and increasing coupling force between a clip and the semiconductor chip.

The present invention also provides a low-cost semiconductor package using a conductive metal structure, configured in such a way that a clip structure is formed of Aluminum (Al) instead of copper (Cu) to achieve weight lightening of the semiconductor package and to reduce manufacturing costs.

According to an aspect of the present invention, a low-cost semiconductor package using a conductive metal structure includes a lead frame including a pad and a lead, a semiconductor chip attached onto the pad of the lead frame, an Aluminum (Al) pad formed on the semiconductor chip, a clip structure having one side adhered to the Al pad and the other side adhered to the lead of the lead frame, and a sealing member formed to surround the semiconductor chip and the clip structure via molding, wherein the semiconductor chip is adhered directly to a junction of the lead frame through a first adhesive layer formed of a solder or epoxy resin-based material and is adhered directly to a junction of the Al pad and the clip structure through a second adhesive layer formed of a solder-based material, and an intermetallic compound (IMC) generated during an adherence procedure is distributed on a predetermined region of each of lower and upper portions of the second adhesive layer by forming the clip structure of an Al material.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Hereinafter, the present invention will be described in detail by explaining exemplary embodiments of the invention with reference to the attached drawings. In the description of the present invention, certain detailed explanations of related art are omitted when it is deemed that they may unnecessarily obscure the essence of the invention.

Figure 1:
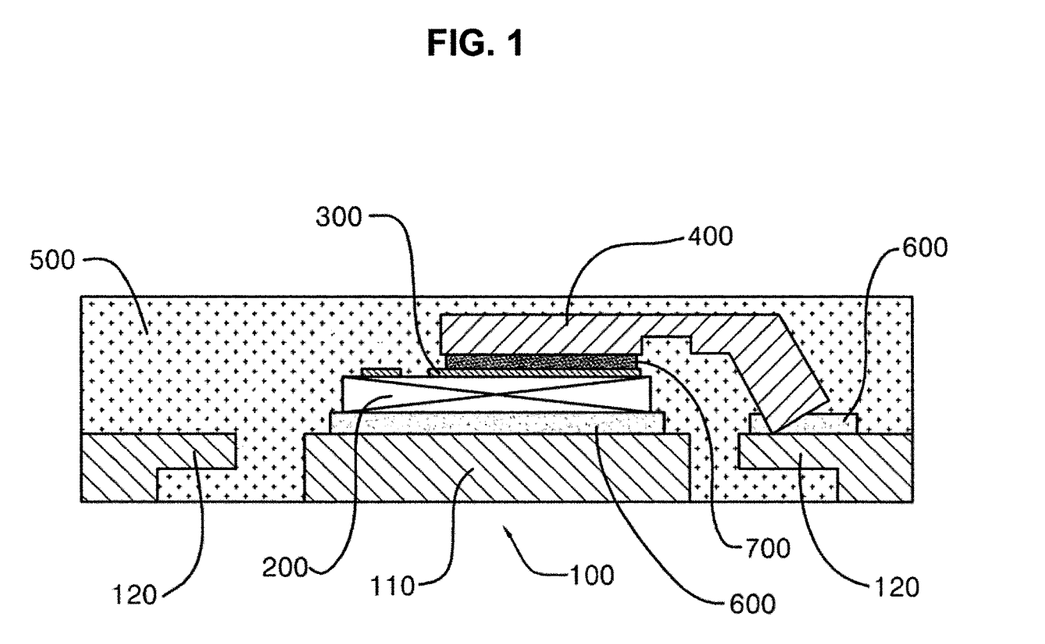
FIG. 1 is a cross-sectional view of a semiconductor package according to a $(1\text{-}1)^{th}$ embodiment of the present invention.

As shown in FIG. 1, a low-cost semiconductor package using a conductive metal structure according to the present invention may include a lead frame 100 including a pad 110 and a lead 120, a semiconductor chip 200 attached onto the pad 110 of the lead frame 100, an Aluminum (Al) pad 300 formed on the semiconductor chip 200, a clip structure 400 having one side adhered to the Al pad 300 and the other side adhered to the lead 120 of the lead frame 100, and a sealing member 500 formed to surround the semiconductor chip 200 and the clip structure 400 via molding.

The semiconductor chip 200 may be adhered directly to a junction of the lead frame 100 through a first adhesive layer 600 formed of a solder or epoxy resin-based material, and may be adhered directly to a junction of the Al pad 300 and the clip structure 400 through a second adhesive layer 700 formed of a solder-based material, and in this case, an intermetallic compound (IMC) 710 generated during an adherence procedure may be distributed on a predetermined region of each of lower and upper portions of the second adhesive layer 700 by forming the clip structure 400 of an Al material.

The Al pad 300 and the clip structure 400 formed of Al, which are exemplified according to the present invention, do not refer to pure metal including 100 parts by weight of Al, but instead, need to be interpreted to be sufficient as long as Al is a main element, i.e., a weight ratio of Al is greater than a minimum of 50%, for example, 55% or greater.

According to the present invention, a separate metal bump for adherence between the Al pad 300 and the clip structure 400 may not be formed, but instead, the clip structure 400 may be soldered directly onto the Al pad 300, and thus, productivity may be enhanced and a structural problem due to use of a metal bump may be overcome.

FIG. 1 illustrates a $(1\text{-}1)^{th}$ embodiment corresponding to a basic embodiment of the present invention. The lead frame 100 may include the pad 110 on which the semiconductor chip 200 is position and the lead 120 that is electrically connected to the semiconductor chip 200, and according to the present invention, a shape of a substrate on which a metal pattern is formed as well as a shape of the lead frame 100 may be modified in any degree. For example, a strong substrate formed of a printed circuit board (PCB), a substrate formed by positioning a metal pattern on an insulating material (ceramic, AlN, $Si_3N_4$, or the like), or a flexible substrate formed of a polyimide material may be included in the lead frame 100.

The Al pad 300 may be formed on the semiconductor chip 200 and may be a component formed with a predetermined thickness because it is not possible to bond the clip structure 400 directly to the semiconductor chip 200 manufactured for wire bonding. The Al pad 300 according to the present invention may be formed with a thickness of 1 to 6 μm to optimize the intermetallic compound (IMC) 710. The thickness of the Al pad 300 may refer to a thickness prior to adherence of the clip structure 400, and thus, when a soldering process of the second adhesive layer 700 is performed, the Al pad 300 may be melted and is diffused to the IMC 710, and thus, the thickness of the Al pad 300 may be reduced to 0 to 4 μm compared with the previous stage.

A change in the thickness of the Al pad 300 will be described below in more detail.

With regard to the thickness of the Al pad 300 according to the present invention, assuming that an initial thickness before soldering is D and a changed thickness after soldering is D1, when the range of the thickness D (before soldering) is M1<D<M2, if the range of the thickness D1 (after soldering) is 0<D1<(⅔)×M2. In this case, value '0' refers to the thickness of an Aluminum (Al) pad in a state in which the thickness of the Al pad is completely melted, and (⅔)×M2 refers to the range of the thickness by which the Al pad is melted by a maximum degree when the Al pad is thickest.

As another example, when the range of the thickness D (before soldering) is 1<D<6, the range of the thickness D1 (after soldering) is 0<D1<4.

As such, when the first thickness D before soldering and the thickness D1 after soldering of the Al pad 300 are within the above ranges, an effect of the present invention may be remarkably achieved.

The clip structure 400 may be a metallic structure for electrical connection between the semiconductor chip 200 and the lead 120 of the lead frame 100 and may be formed of an Al material. A conventional metallic clip is formed of only a copper (Cu) due to a problem in terms of soldering, but according to the present invention, the clip structure 400 formed of an Al material may be easily adhered via soldering, and thus, may be applicable.

As such, the clip structure 400 may be formed of an Al material, and thus a unit cost may be remarkably reduced compared with a conventional metallic clip formed of a Cu material to reduce manufacturing costs of a semiconductor package, and the weight of the clip structure 400 may be reduced to achieve weight-lightening of the semiconductor package.

The adhesive layer according to the present invention may include two types of layers. That is, the first adhesive layer 600 may be applied to a junction of the lead frame 100, and the second adhesive layer 700 may be applied to a junction between the Al pad 300 and the clip structure 400. The first adhesive layer 600 may use a conductive adhesive such as a solder or epoxy resin-based material and may be any type of adhesive without limitations as long as the adhesive is electrically connectable.

However, the second adhesive layer 700 may use only a solder-based adhesive, and unlike the first adhesive layer 600, the second adhesive layer 700 may not use an epoxy-based conductive adhesive because it is not possible to generate the IMC 710 during an adherence procedure.

Figure 2:
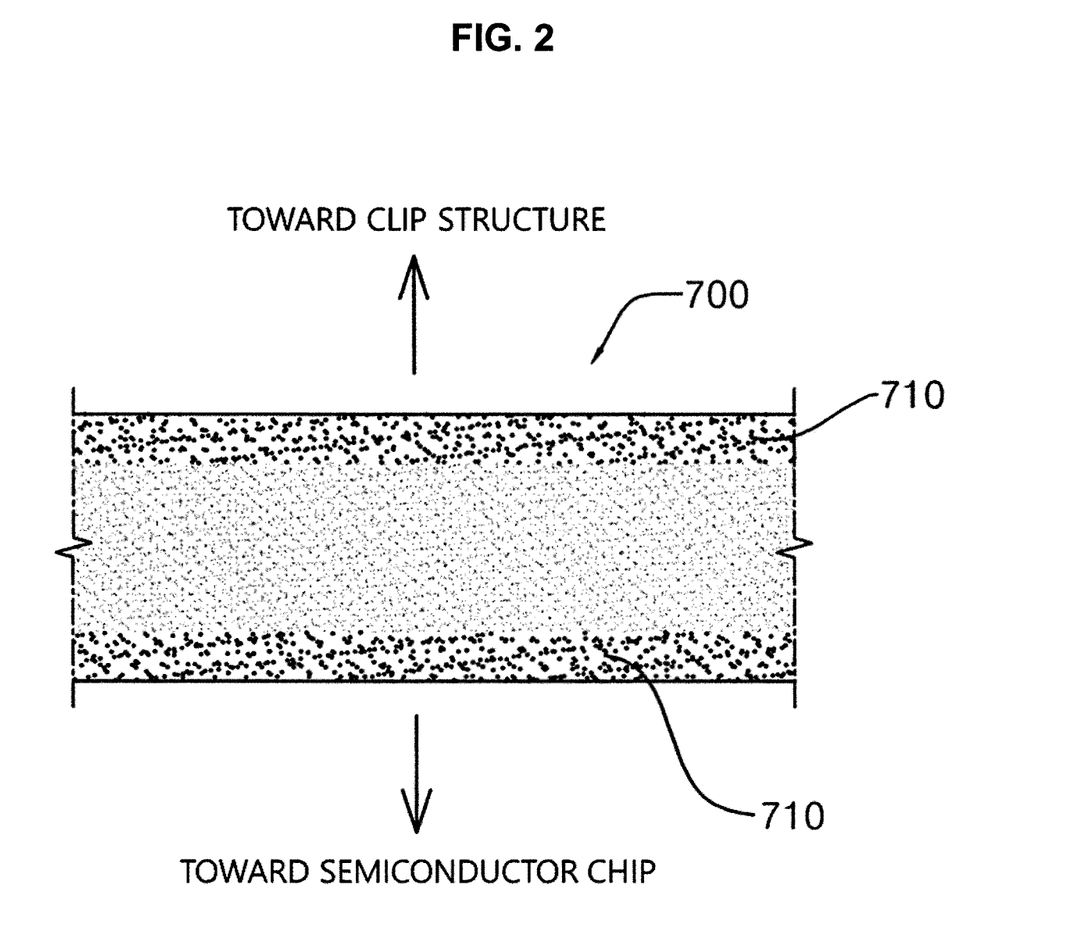
FIG. 2 is a diagram showing the configuration of a second adhesive layer according to the present invention.

As shown in FIG. 2, the IMC 710 may be distributed on a predetermined region of lower and upper portions of the second adhesive layer 700, which corresponds to a portion adjacent to the Al pad 300 and the clip structure 400 formed of Al, and may be a compound generated via an interface reaction between a metal element in the solder and a metal material that is separated while the Al pad 300 and the clip structure 400 are partially melted at a specific temperature or grater during a soldering procedure. The IMC 710 may partially include materials corresponding to the metal element of the solder, but according to the present invention, the IMC 710 may include a predetermined amount of Al, above all.

As such, the IMC 710 including Al distributed in the second adhesive layer 700 has similar metal property to the Al pad 300 and the clip structure 400, and thus, may have low structural stress due to a thermal expansion coefficient and enhance durability and electrical connection properties.

The prevent invention verified that 0.5 to 30 parts by weight of Al is present in the IMC 710 when 80 parts by weight of tin (Sn) or greater is used based on 100 parts by weight of IMC if soldering adherence is performed on the Al pad 300 and the clip structure 400. In this case, as shown in FIG. 3A, the IMC 710 is diffused and distributed in a region at a height in the range within about 30 μm based on a boundary surface of the Al pad 300.

The present invention verified that 0.5 to 30 by weight of Al is present in the IMC 710 when 80 parts by weight of lead (Pb) or greater is used based on 100 parts by weight of IMC if soldering adherence is performed on the Al pad 300 and the clip structure 400. In this case, as shown in FIG. 3B, the IMC 710 is densely distributed in a region at a height in the range within about 20 um based on a boundary surface of the Al pad 300.

Figure 3A:
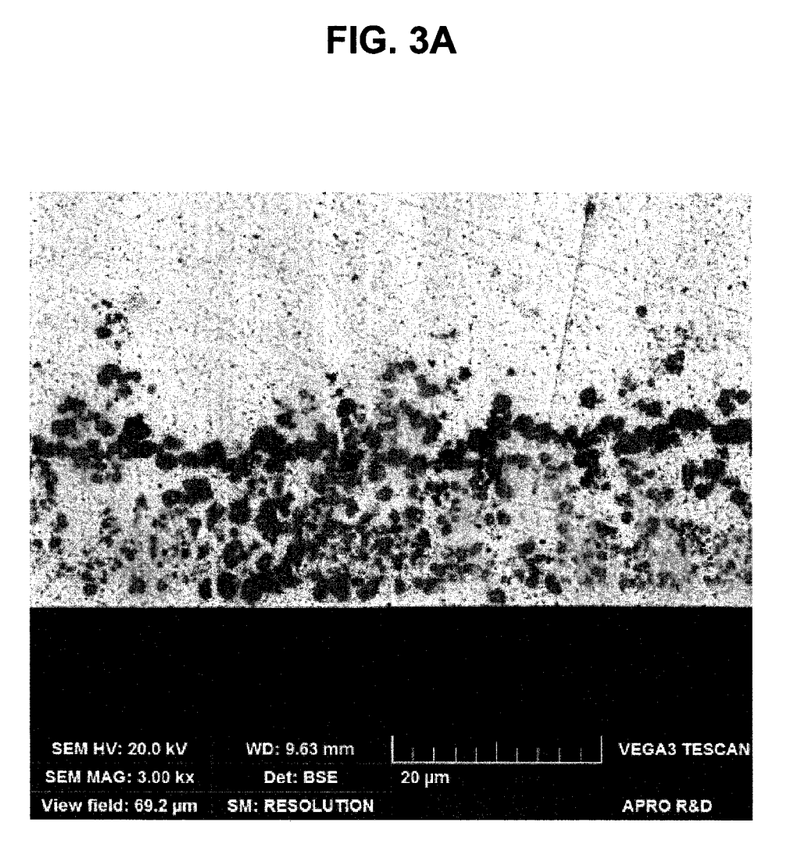
FIG. 3A is an enlarged image of a case in which an intermetallic compound (IMC) is distributed when a second adhesive layer includes tin (Sn) as a main element, according to the present invention.
Figure 3B:
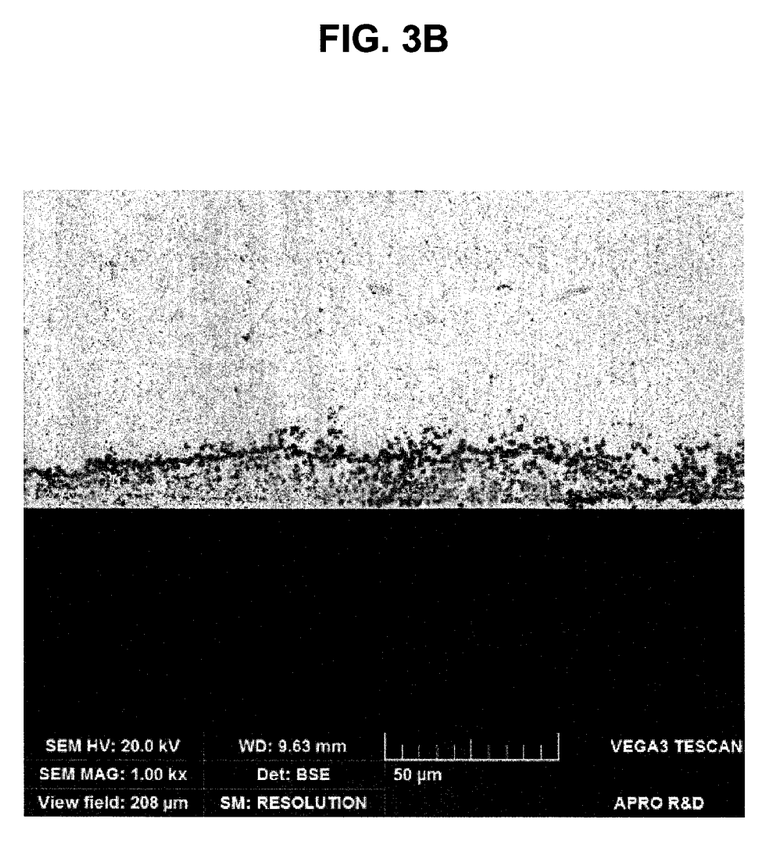
FIG. 3B is an enlarged image of a case in which an IMC is distributed when a second adhesive layer includes lead (Pb) as a main element, according to the present invention.
Figure 3C:
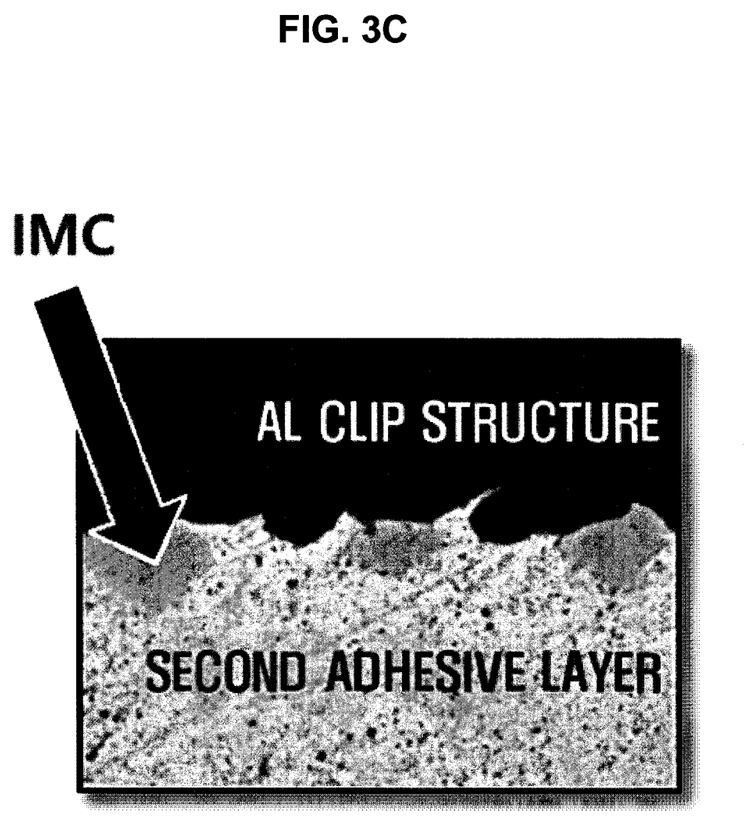
FIG. 3C is an enlarged image of a case in which an IMC is distributed around a clip structure of a second adhesive layer according to the present invention.

FIGS. 3A to 3B are enlarged views of a portion of a boundary surface of the IMC 710 formed below the second adhesive layer 700, that is, the Al pad 300. FIG. 3C is an enlarged view of a portion of a boundary surface of the IMC 710 formed above the second adhesive layer 700, that is, the clip structure 400.

As such, a ratio of Al in the IMC 710 may be 0.5 to 30 parts by weight based on 100 parts by weight of the entire IMC 710, and in this regard, when content of Al is less than 0.5 parts by weight, it may be difficult to appropriately achieve an effect due to the above adhesion property, and when content of Al is greater than 30 parts by weight, there may be a problem in that hardness of an adhesive portion is lowered due to excessive content of an Al element and coupling force is rather degraded.

The inventor verified that the height of the IMC 710 is not greater than a maximum of 30 um from an upper surface of the Al pad and forms a strong and dense structure at a boundary portion when a ratio of Al is equal to or greater than 5 parts by weight. In addition, the inventor verified that the height of the IMC 710 is not greater than a maximum of 25 um from a lower surface of the clip structure 400 and forms a strong and dense structure at a boundary portion. As such, according to the present invention, the IMC 710 including Al as an element such as a basic material may be intensively distributed on upper and lower boundary surfaces, and thus, physically and chemically excellent physical properties may be achieved.

However, 5 parts by weight or more of the IMC 710 may be sporadically discovered in a soldering region, that is, in a soldering layer between the IMC 710 at a side of a semiconductor chip and the IMC 710 at a side of an Al clip.

As described above, according to the present invention, to configure the Al element of the IMC 710, a melting promoter may be further included in the second adhesive layer 700 to smoothly perform soldering. An example of the melting promoter may be antimony (Sb), a predetermined amount of Sb is included in the second adhesive layer 700, and in this regard, the antimony (Sb) may effectively melt the Al pad 300 and the clip structure 400 in a soldering condition at 200 to 300° C. and, thus, Al elements may be included in the IMC 710.

Conventionally, these elements are not present in adhesives and a bonding pad formed of an Al material is not smoothly melted, and thus, a metal bump may be attached via metal such as Ag, Au, and Pb to achieve soldering. Accordingly, according to the present invention, the second adhesive layer 700 may further include a melting promoter for facilitation of melting of the Al pad 300 and the clip structure 400, and thus, it may be advantageous that the clip structure 400 may be directly adhered without use of a separate metal bump and coupling properties may be excellent due to Al included in the IMC 710.

Figure 4:
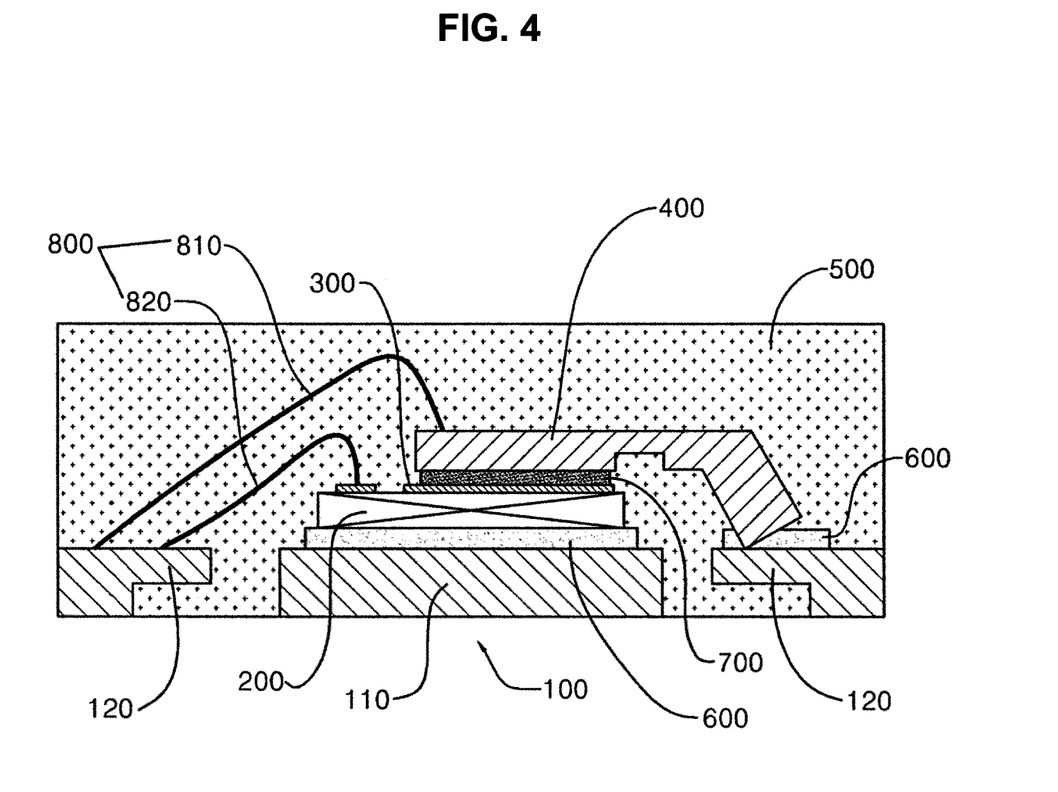
FIG. 4 is a diagram showing a semiconductor package according to a $(1\text{-}2)^{th}$ embodiment of the present invention.

FIG. 4 illustrates a $(1-2)^{th}$ embodiment of the present invention, which is obtained by further connecting a bonding wire 800 for additional electrical connection in addition to the $(1-1)^{th}$ embodiment. The bonding wire 800 may include a first bonding wire 810 and a second bonding wire 820.

The first bonding wire 810 may connect the clip structure 400 to other components, and in this regard, the first bonding wire 810 may be connected to the lead 120 of the lead frame 100 as shown in the drawing or may be connected to another second semiconductor chip (not shown) that is not shown in the drawing.

As necessary, the second bonding wire 820 may be a component for electrically connecting the semiconductor chip 200 and the lead 120 to an opposite side to which the clip structure 400 is connected.

According to the $(1-2)^{th}$ embodiment, the first bonding wire 810 may be boned directly to the clip structure 400 formed Al. When a metallic clip is formed of a Cu material like in a conventional case, the metallic clip is vulnerable to oxidation due to the properties of Cu, and thus, plating-processing needs to be performed using metal such as silver, gold, or nickel for bonding. Accordingly, according to the present invention, the second bonding wire 820 may be directly bonded to the clip structure 400 without a separate plating process, thereby enhancing productivity, and a separate plating process may not be performed to lower producing costs.

Figure 5:
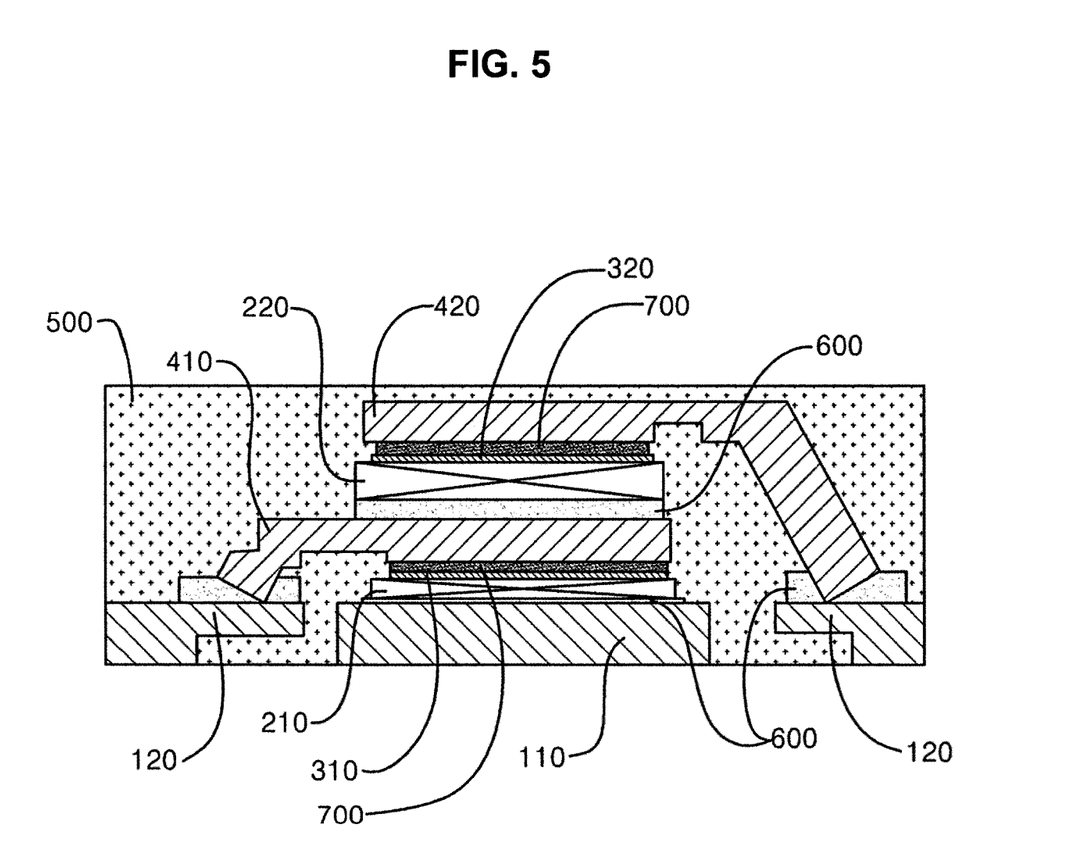
FIG. 5 is a diagram showing a semiconductor package according to a $(2\text{-}1)^{th}$ embodiment of the present invention.

FIG. 5 is a diagram showing a semiconductor package according to a $(2-1)^{th}$ embodiment of the present invention. The semiconductor package may be configured by stacking and connecting two semiconductor chips 200 and two clip structures 400. With regard to a detailed description of the configuration of the $(2-1)^{th}$ embodiment, the semiconductor package may include the lead frame 100 including the pad 110 and the lead 120, a first semiconductor chip 210 attached onto the pad 110 of the lead frame 100, a first Al pad 310 formed on the first semiconductor chip 210, a first clip structure 410 having one side adhered to the first Al pad 310 and the other side adhered to the lead 120 of the lead frame 100, a second semiconductor chip 220 attached onto the first clip structure 410, a second Al pad 320 formed on the second semiconductor chip 220, a second clip structure 420 having one side adhered to the second Al pad 320 and the other side adhered to the lead 120 of the lead frame 100, and the sealing member 500 formed to surround the first and second semiconductor chips 210 and 220 and the first and second clip structures 410 and 420 via molding.

The first semiconductor chip 210 and the pad 110 of the lead frame 100 may be adhered to each other through the first adhesive layer 600 formed of a solder or epoxy resin-based material, and the first clip structure 410 and the second semiconductor chip 220 may be adhered to each other through the first adhesive layer 600 formed of a solder or epoxy resin-based material. The first Al pad 310 and the first clip structure 410 may be directly adhered to each other through the second adhesive layer 700 formed of a solder-based material, and the second Al pad 320 and the second clip structure 420 may be directly adhered to each other through the second adhesive layer 700 formed of a solder-based material, and in this case, the first and second clip structures 410 and 420 may be formed of an Al material, and thus, the IMC 710 generated during an adherence procedure may be distributed on each of upper and lower portions.

Like in the $(1\text{-}1)^{th}$ and $(1\text{-}2)^{th}$ embodiments, according to the (2-1) embodiment, the IMC 710 of the second adhesive layer 700 may include Aluminum (Al), and a ratio of Al may be 2 to 30 parts by weight based on 100 parts by weight of the entire IMC 710. The properties depending on the thickness of the Al pad 300 may also be commonly applied to the $(1\text{-}1)^{th}$ embodiment, and thus, a repeated description will be omitted.

Like in the aforementioned embodiments, the second adhesive layer 700 according to the $(2\text{-}1)^{th}$ embodiment may also be configured in such a way that the IMC generated during a soldering process may be distributed on upper and lower portions through the first and second Al pads 310 and 320 and the first and second clip structures 410 and 420, which are positioned on the upper and lower portions.

Figure 6:
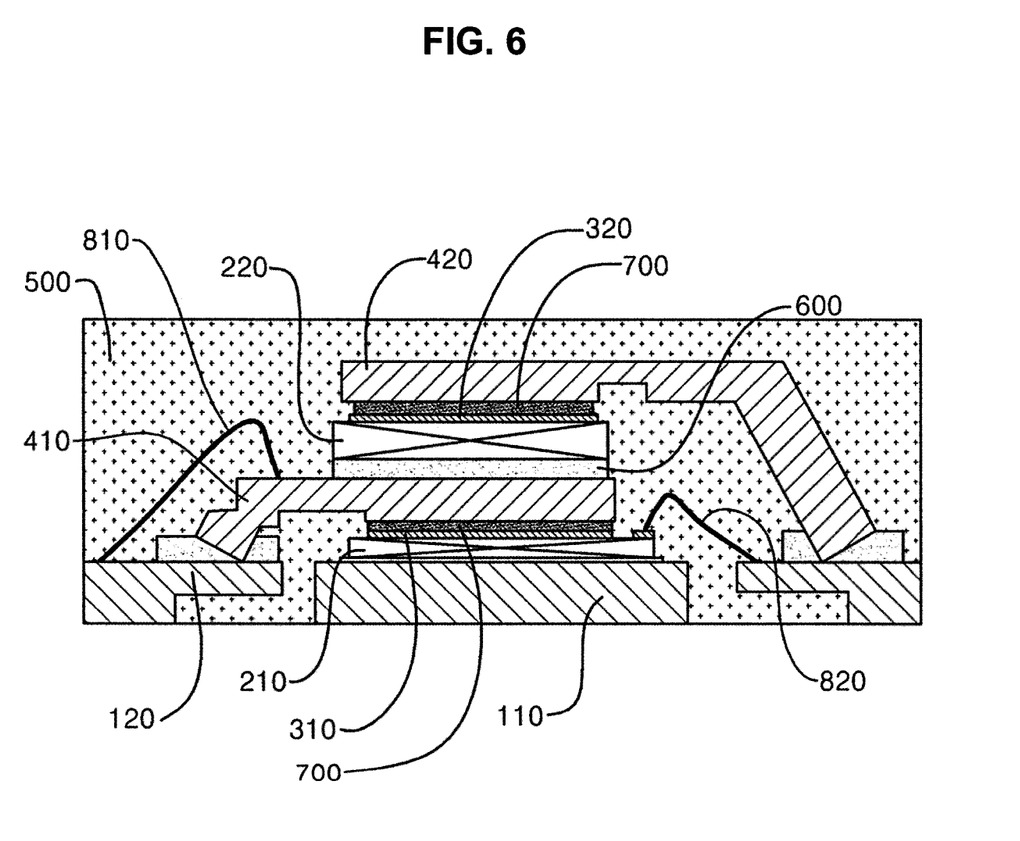
FIG. 6 is a diagram showing a semiconductor package according to a $(2\text{-}2)^{th}$ embodiment of the present invention.

FIG. 6 illustrates a $(2\text{-}2)^{th}$ embodiment, which is obtained by further configuring the first bonding wire 810 and the second bonding wire 820 for additional electrical connection. The first bonding wire 810 may be a component for electrically connecting the first clip structure 410 and the lead 120 and may be directly bonded onto the first clip structure 410 formed of Al.

As necessary, the second bonding wire 820 may be a component for electrically connecting the lead 120 of the first semiconductor chip 200 to an opposite side to which the first clip structure 410 is connected and may be boned onto the first Al pad 310.

In addition, needless to say, also in the $(2\text{-}2)^{th}$ embodiment, the first bonding wire 810 may be connected to another second semiconductor chip (not shown) that is not shown in the drawing as well as the lead 120. In addition, an effect obtained by directly bonding the first bonding wire 810 to the Al pad has been described above.

Next, a third embodiment of the present invention is the same as the first embodiment expect that a pad formed of a silver (Ag) material instead of the Al pad 300 is used as metal that is lastly exposed above a semiconductor chip. In this case, it is verified that Ag has a weight ratio of 30 to 90 parts by weight based on an entire weight of the IMC 710 formed in an Al clip region and Al has parts by weight of 1 to 30. In this case, needless to say, the same effect as in the aforementioned embodiments may also be expected.

According to the diverse exemplary embodiments of the present invention, a clip type conductive metal structure may be adhered to an Al pad formed on a semiconductor chip, and the metal structure may be soldered to be adhered directly to the Al pad, without formation of a separate metal bump on a surface of the Al pad like in a conventional art, and thus, the number of manufacturing processes may be reduced to enhance productivity and a structural problem due to use of a metal bump may be overcome, thereby enhancing durability and electrical connection properties.

According to the present invention, a conductive metal structure may be formed of Al, and thus, the weight thereof may be remarkably reduced compared with a conventional metal structure of a Cu material to achieve weight lightening of a semiconductor package, and a unit cost may be lowered to a level of ⅓ of the conventional case to lower manufacturing cost of the semiconductor package.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A low-cost semiconductor package using a conductive metal structure, comprising:
   a lead frame including a pad and a lead;
   a semiconductor chip attached onto the pad of the lead frame;
   an Aluminum (Al) pad formed on the semiconductor chip;
   a clip structure having one side adhered to the Al pad and the other side adhered to the lead of the lead frame; and
   a sealing member formed to surround the semiconductor chip and the clip structure via molding,
   wherein the semiconductor chip and the pad of the lead frame are adhered to each other through a first adhesive layer formed of a solder or epoxy resin-based material, the Al pad and the clip structure are adhered to each other through a second adhesive layer formed of a solder-based material, and an intermetallic compound (IMC) generated during an adherence procedure is distributed on a predetermined region of each of lower and upper portions of the second adhesive layer by forming the clip structure of an Al material,
   wherein the second adhesive layer comprises:
      an upper IMC layer located adjacent to the clip structure, wherein the upper IMC layer includes Al and is in direct contact with the clip structure;
      a lower IMC layer located adjacent to the Al pad, wherein the lower IMC layer includes Al; and
      a solder layer provided between the upper and lower IMC layers.

2. The low-cost semiconductor package using a conductive metal structure of claim 1, wherein the IMC of the second adhesive layer includes Aluminum (Al), a ratio of the Al in the IMC is 0.5 to 30 parts by weight based on 100 parts by weight of the entire IMC.

3. The low-cost semiconductor package using a conductive metal structure of claim 2, wherein, when a ratio of the Al is equal to or greater than 5 parts by weight, a height of the IMC is not greater than maximum of 30 μm from an upper surface of the Al pad and is not greater than maximum of 25 μm from a lower surface of the clip structure.

4. The low-cost semiconductor package using a conductive metal structure of claim 1, further comprising a bonding wire that is electrically connected to the clip structure,
   wherein the bonding wire is directly bonded to a clip structure formed of Al.

5. The low-cost semiconductor package using a conductive metal structure of claim 1, wherein the clip structure includes at least 55 parts by weight of Al based on 100 parts by weight of the clip structure.

6. A low-cost semiconductor package using a conductive metal structure, comprising:
   a lead frame including a pad and a lead;
   a first semiconductor chip attached onto the pad of the lead frame;

a first Aluminum (Al) pad formed on the first semiconductor chip;
a first clip structure having one side adhered to the first Al pad and the other side adhered to the lead of the lead frame;
a second semiconductor chip attached onto the first clip structure;
a second Al pad formed on the second semiconductor chip;
a second clip structure having one side adhered to the second Al pad and the other end coupled to the lead of the lead frame; and
a sealing member formed to surround the first and semiconductors and the second structures via molding,
wherein the first semiconductor chip and the pad of the lead frame are adhered to each other through a first adhesive layer formed of a solder or epoxy resin-based material, the first clip structure and the second semiconductor chip are adhered to each other through a second adhesive layer formed of a solder or epoxy resin-based material, the first Al pad and the first clip structure are directly adhered to each other through a third adhesive layer formed of a solder-based material, and the second Al pad and the second clip structure are directly adhered to each other through a fourth adhesive layer formed of a solder-based material, the first and second clip structures are formed of an Al material, and an intermetallic compound (IMC) generated during an adherence procedure is distributed on each of upper and lower portions of the third and fourth adhesive layers,
wherein the third adhesive layer comprises:
   a first upper IMC layer located adjacent to the first clip structure, wherein the first upper IMC layer includes Al and is in direct contact with the first clip structure;
   a first lower IMC layer located adjacent to the first Al pad, wherein the first lower IMC layer includes Al; and
   a first solder layer provided between the first upper and lower IMC layers, wherein the fourth adhesive layer comprises:
   a second upper IMC layer located adjacent to the second clip structure, wherein the second upper IMC layer includes Al and is in direct contact with the second clip structure;
   a second lower IMC layer located adjacent to the second Al pad, wherein the second lower IMC layer includes Al; and
   a second solder layer provided between the second upper and lower IMC layers.

7. The low-cost semiconductor package using a conductive metal structure of claim 6, wherein the IMC of the third and fourth adhesive layers includes Aluminum (Al), and a ratio of the Al is 0.5 to 30 parts by weight based on 100 parts by weight of the entire IMC.

8. The low-cost semiconductor package using a conductive metal structure of claim 7, wherein, when the ratio of the Al is equal to or greater than 5 parts by weight, a height of the IMC is not greater than maximum of 30 μm from an upper surface of the Al pad and is not greater than maximum of 25 μm from a lower surface of the first clip structure.

9. The low-cost semiconductor package using a conductive metal structure of claim 6, further comprising a bonding wire that is electrically connected to the first clip structure, wherein the bonding wire is bonded directly to a first clip structure formed of Aluminum (Al).

10. The low-cost semiconductor package using a conductive metal structure of claim 6, wherein the first and second clip structures respectively include at least 55 parts by weight of Al based on 100 parts by weight of the first and second clip structures.

* * * * *